(12) United States Patent
Sarioglu et al.

(10) Patent No.: US 8,400,265 B2
(45) Date of Patent: Mar. 19, 2013

(54) TOUCHLESS KEYLESS ENTRY KEYPAD INTEGRATED WITH ELECTROLUMINESCENCE BACKLIGHT

(75) Inventors: Guner R. Sarioglu, Oakland Township, MI (US); Ryan Xue, Windsor (CA)

(73) Assignee: Magna International Inc. (CA)

( * ) Notice: Subject to any disclaimer, the term of this patent is extended or adjusted under 35 U.S.C. 154(b) by 226 days.

(21) Appl. No.: 12/678,589

(22) PCT Filed: Sep. 11, 2008

(86) PCT No.: PCT/CA2008/001595
§ 371 (c)(1),
(2), (4) Date: Jul. 26, 2010

(87) PCT Pub. No.: WO2009/036552
PCT Pub. Date: Mar. 26, 2009

(65) Prior Publication Data
US 2010/0296303 A1    Nov. 25, 2010

Related U.S. Application Data

(60) Provisional application No. 60/994,106, filed on Sep. 17, 2007.

(51) Int. Cl.
*B60R 25/00* (2006.01)
(52) U.S. Cl. .......... 340/5.72; 340/5.54; 313/510
(58) Field of Classification Search ............ 340/5.8, 340/5.54, 5.72; 362/459; 313/510, 511, 313/512
See application file for complete search history.

(56) References Cited

U.S. PATENT DOCUMENTS

| | | | |
|---|---|---|---|
| 2,456,376 A | 12/1948 | Chirelstein | |
| 4,743,895 A | 5/1988 | Alexander | |
| 4,965,950 A | 10/1990 | Yamada | |
| 5,565,733 A * | 10/1996 | Krafcik et al. | 313/510 |
| 5,684,633 A | 11/1997 | Lutz et al. | |
| 5,826,967 A | 10/1998 | Mathieu | |
| 5,877,492 A * | 3/1999 | Fujieda et al. | 250/208.1 |
| 6,028,591 A | 2/2000 | Lueders | |
| RE38,175 E * | 7/2003 | Ariki et al. | 349/57 |
| 6,664,489 B2 | 12/2003 | Kleinhans et al. | |
| 7,186,936 B2 | 3/2007 | Marcus et al. | |
| 7,350,949 B2 | 4/2008 | Meinke et al. | |
| 7,576,631 B1 | 8/2009 | Bingle et al. | |
| 7,825,905 B2 * | 11/2010 | Philipp | 345/173 |
| 7,897,233 B2 * | 3/2011 | Esposito et al. | 428/67 |
| 7,911,321 B2 * | 3/2011 | Bingle et al. | 340/5.54 |
| 2002/0073518 A1 * | 6/2002 | Chesson et al. | 24/455 |
| 2003/0032025 A1 | 2/2003 | Lemieux et al. | |
| 2003/0216817 A1 | 11/2003 | Pudney | |
| 2004/0053648 A1 | 3/2004 | Gremo et al. | |

(Continued)

FOREIGN PATENT DOCUMENTS
CA    2228330    8/1998
WO    0011689    3/2000

(Continued)

*Primary Examiner* — Jennifer Mehmood
*Assistant Examiner* — Rufus Point
(74) *Attorney, Agent, or Firm* — Warn Partners, P.C.; Marc Luddy (57) ABSTRACT

The present invention is a dead front actuating assembly, including a first layer having at least one selectively illuminated area, and a second layer having a plurality of sensors used for activating the at least one selectively illuminated area such that the at least one selectively illuminated area becomes illuminated, and the first layer is adjacent to the second layer.

23 Claims, 8 Drawing Sheets

U.S. PATENT DOCUMENTS

| | | | |
|---|---|---|---|
| 2005/0030195 A1* | 2/2005 | Nedorezov | 340/825.69 |
| 2005/0190040 A1* | 9/2005 | Huntzicker et al. | 340/5.54 |
| 2005/0242923 A1* | 11/2005 | Pearson et al. | 340/5.62 |
| 2006/0145825 A1* | 7/2006 | Mc Call | 340/426.35 |
| 2006/0262549 A1* | 11/2006 | Schmidt et al. | 362/459 |
| 2008/0202912 A1* | 8/2008 | Boddie et al. | 200/600 |
| 2008/0204428 A1* | 8/2008 | Pierce et al. | 345/174 |
| 2009/0046072 A1* | 2/2009 | Emig et al. | 345/173 |
| 2009/0257241 A1* | 10/2009 | Meinke et al. | 362/546 |
| 2010/0076527 A1* | 3/2010 | Hammond et al. | 607/88 |
| 2010/0219935 A1* | 9/2010 | Bingle et al. | 340/5.54 |

FOREIGN PATENT DOCUMENTS

WO     2006060745     6/2006

\* cited by examiner

TOUCHLESS KEYLESS ENTRY KEYPAD INTEGRATED WITH ELECTROLUMINESCENCE BACKLIGHT

CROSS-REFERENCE TO RELATED APPLICATIONS

This application is a PCT International Application of U.S. Provisional Patent Application No. 60/994,106 filed on Sep. 17, 2007. The disclosure of the above application is incorporated herein by reference.

FIELD OF THE INVENTION

The present invention relates a type of keyless entry system for an automobile. More specifically, the present invention is a dead front actuating assembly, which is both contact and non-contact, and is used for providing keyless entry into an automobile, and is not visible in a deactivated state.

BACKGROUND OF THE INVENTION

Vehicles which incorporate the use of keyless entry are known. Typical keyless entry systems have a keypad which is either permanently visible, or selectively visible on the outside of the vehicle. When it is desired to enter the vehicle, the correct combination of numbers are depressed on the keypad, and the keypad sends a signal to the vehicle's electronic control unit, or a separate controller, and a signal is sent to the vehicle door locks to unlock the vehicle.

There have been many various systems which are used to achieve the use of a keyless entry system, one of which is to incorporate the use of a non-contact sensor in conjunction with a keyless entry system which is only visible when desired. These keyless entry systems are commonly located in the vehicle's "B-pillar," the B-pillar is the portion of the vehicle located between the front and rear doors (on a four-door vehicle). Most of these systems incorporate the use of a lighting device, such as a light emitting diode (LED) for providing illumination of the keypad. However, the use of LEDs or other light bulbs for providing selective illumination of the keypad raises packaging concerns because of the space occupied by the light bulbs.

Therefore, there exists a need for an improved method of illuminating a keypad for a keyless entry system in an automobile.

SUMMARY OF THE INVENTION

The present invention is a dead front actuating assembly for providing keyless entry into an automobile. The invention includes a first layer having at least one selectively illuminated area for providing an indication of the various components used to provide keyless entry. There is also a second layer having a plurality of sensors used for activating the selectively illuminated area such that the at least one selectively illuminated area becomes illuminated when it is desired to enter the vehicle through the use of the present invention. The first layer is adjacent to the second layer so as to reduce the amount of packaging required by the present invention.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
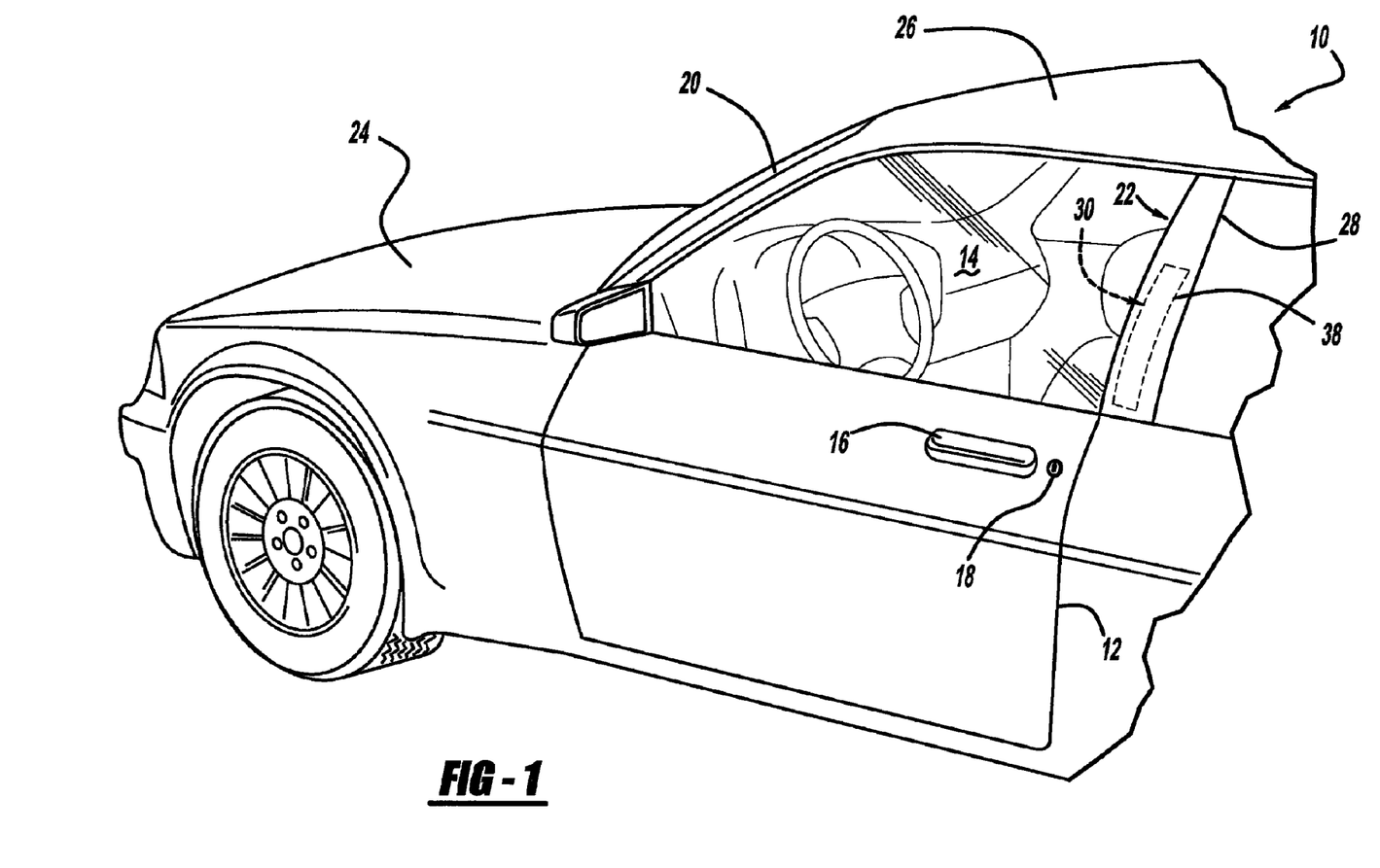
FIG. 1 is a perspective side view of an automobile incorporating a dead front actuating assembly, according to the present invention.

Referring to FIG. 1, a side view of a motor vehicle 10 is shown partially cut away. The motor vehicle has a side door 12 that provides access to a passenger compartment 14 of the motor vehicle 10. This side door 12 includes a door handle 16 and a key hole 18 for standard locking and unlocking using a key (not shown). The motor vehicle 10 also includes an A-pillar 20 and a B-pillar, shown generally at 22, extending up from a main body 24 of the motor vehicle 10 to a roof 26.

In the embodiment shown in FIG. 1, the B-pillar 22 is covered by a cover plate 28. The cover plate 28 is a tinted black or dark color polycarbonate or acrylic in standard ambient light conditions. Standard ambient light conditions include any type of outdoor lighting or the lack thereof. Therefore, the cover plate 28 appears opaque in sunlight, darkness, and artificial, non-coherent light sources, which are typically used to provide lighting in darkness. The cover plate 28 covers the B-pillar 22 and adds to the overall aesthetic design of the motor vehicle 10. More specifically, the cover plate 28 is used as a part of the overall design of the exterior of the motor vehicle 10.

The cover plate 28 may cover a portion of the B-pillar 22 or it may cover the entire B-pillar 22. The composition of the cover plate 28 allows the cover plate 28 to act as a "dead front," meaning that it is opaque with respect to electromagnetic radiation in the visible portion of the spectrum of electromagnetic radiation, but transparent with respect to the radio frequency portion of the spectrum, in addition, the dead front cover plate 28 is transparent to magnetic radiation as will be discussed later. In this embodiment, the cover plate 28 is a tinted black or dark color polycarbonate, lexan, Lucite, ABS, nylon, polyethylene, polypropylene, acrylic or copolymers thereof.

While tinted black or dark color transparent polymers are disclosed above, any type of material which at least partially or fully hides a key pad in ambient light but renders a key pad visible through back lighting or other methods is useable in the present invention. For instance, mirrored or metallized films or materials, frosted or tinted glass, electrochromic materials or other changeable films or surfaces which are, or can be rendered, opaque under ambient light but allow viewing of the key pad when desired are also useful as cover plate 28 in the subject invention.

The cover plate 28 covers a dead front actuating assembly, generally indicated at 30, and shown in phantom in FIG. 1. The dead front actuating assembly 30 is an assembly that allows for the side door 12 to be unlatched and opened without requiring the use of a key fob entry or a manual key, the manual key is inserted into the key hole 18. Like the key fob actuation, the dead front actuating assembly 30 is commonly referred to as a type of keyless entry. While the dead front actuating assembly 30 is described herein as a keyless entry system, it should be appreciated by those skilled in the art that the dead front actuating assembly 30 may be utilized for any type of system that requires actuation. Such systems may include, but are not limited to, the unlocking of tailgates and lift gates, the activation of appropriate illuminating switches, and the activation or deactivation of any other electronic component incorporated into the motor vehicle 10.

Because the cover plate 28 covers the dead front actuating assembly 30, the cover plate 28 provides the dead front feature. More specifically, because the cover plate 28 is opaque with respect to the view from the human eye, it appears as if there is nothing behind the cover plate 28 when the dead front actuating assembly 30 is deactivated. With regard to location, the dead front actuating assembly 30 may be used with any pillar, driver or passenger side, or any surface that is capable of having a polycarbonate, acrylic, or similar construction where a reduced amount of space is available for the dead front actuating assembly 30 to be mounted. The location may be on the exterior of the motor vehicle 10, the inside of the passenger compartment 14, or inside an engine storage compartment. The dead front actuation assembly 30 described herein could also be used in a number of vehicle interior applications where a completely sealed surface is advantageous or desired, such as door switches (to avoid penetration of the switch box by rain or other external moisture), and center consoles next to cup holders. Another type of use would be to use the non-contact dead front actuating assembly 30 to activate and become visible when it is detected that a passenger has occupied a seat.

Figure 2:
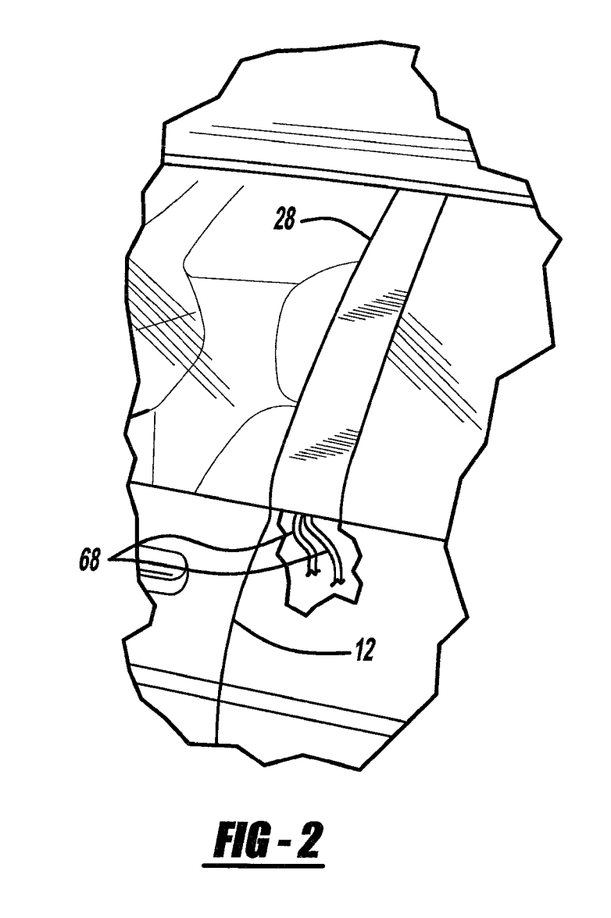
FIG. 2 an enlarged fragmentary perspective side view of an automobile incorporating a dead front actuating assembly in a deactivated state, according to the present invention.
Figure 3:
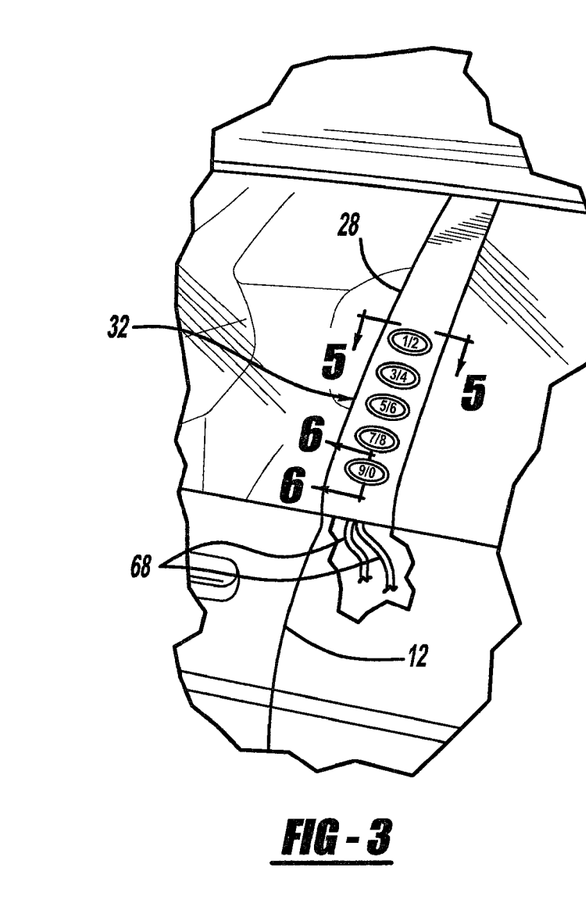
FIG. 3 is an enlarged fragmentary perspective side view of an automobile incorporating a dead front actuating assembly in an activated state, according to the present invention.

Referring to FIGS. 2 and 3, the cover plate 28 is shown with the dead front actuating assembly 30 deactivated and activated, respectively. In the deactivated state, the dead front actuating assembly 30 is invisible due to the opaque nature of the cover plate 28 (FIGS. 1 and 2). In the activated state (FIG. 3), a keypad, generally shown at 32, is illuminated and visible through the cover plate 28. In the embodiment shown, the keypad 32 includes a plurality of switches 34 that are used in a combination to unlock the latch of the side door 12. The switches 34 are pressed in a specific order, which then causes the latch of the side door 12 to become unlocked. The order or combination of how the switches 34 are used is modifiable, either by the operator, or during manufacturing, such that different combinations can be used with regard to different users and vehicles 10. It should be appreciated by those skilled in the art that the keypad 32 and the dead front actuating assembly 30 may also be used to lock the side door 12, preventing access to the passenger compartment 14.

It should be noted that radio or magnetic identification (radio or magnetic ID) could be used for activating the switches 34 to unlock the door 12. It should also be noted that the keypad 32 in combination with the plurality of switches 34 may be used for performing other functions in the vehicle 10 as well. For instance, the switches 34 can be wired to start or shut off the vehicle's 10 engine, activate or deactivate the radio, tune the radio, operate the windows, activate or deactivate lights such as headlights, fog lights, or parking lights, activate an on-board navigation system, telephone, or the like, as well as operate power seats and power adjustable foot pedals.

Figure 5:
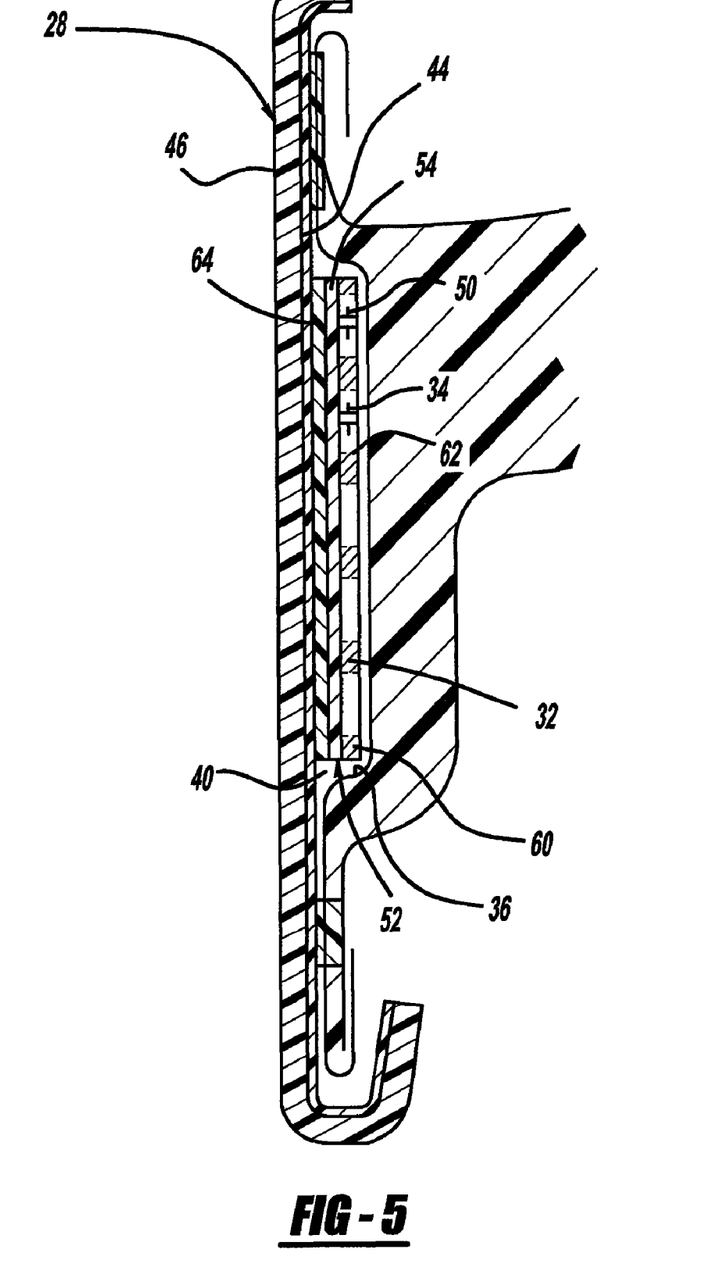
FIG. 5 is a sectional view taken along lines 5-5 of FIG. 3.

Referring to FIG. 5, a top view of the dead front actuating assembly 30 is shown with the cover plate 28 in cross section. The dead front actuating assembly 30 includes a housing 36 that defines a periphery 38 (best shown in FIG. 1) and an interior volume 40. The housing 36 is fixedly secured to the cover plate 28 at the periphery 38.

The cover plate 28 defines an inboard surface 44 and an outboard surface 46. The inboard surface 44 is fixedly secured to the motor vehicle 10, whereas the outboard surface 46 is visible to those outside the motor vehicle 10. Therefore, the inboard surface 44 faces the interior volume 40 and the outboard surface 46 is opposite the inboard surface 44 and it is the outboard surface 46 that appears to be opaque to those standing outside the motor vehicle 10 in standard ambient light conditions. The switches 34 are operable with the cover plate 28. The switches 34 are touch sensitive. More specifically, each of the plurality of switches 34 are activated by touching the cover plate 28 in direct proximity to the specific switch 34 being "pressed" or activated. The switches 34 are sensors that detect a change in the capacitance of the cover plate 28 in direct proximity to the location of the particular switch 34. The dead front actuating assembly 30 also includes a presence sensor 50. The presence sensor 50 identifies when an operator is disposed adjacent the cover plate 28. In this embodiment, the presence sensor 50 is a touch sensor. The presence sensor 50 is a device such as a transceiver that sends a signal to ping a key fob (not shown) to identify when the key fob enters the space in immediate proximity to the dead front actuating assembly 30, the plurality of switches 34 are then illuminated by the dead front actuating assembly 30.

The presence sensor 50 and the plurality of switches 34, in some embodiments, may be the same type of sensors. In fact, activating one of the plurality of switches 34 through touch may act as the presence sensor 50 to activate the non-contact dead front actuating assembly 30. In other instances, the presence sensor 50 and the plurality of switches 34 may be designed to be capacitive sensors, touch sensitive sensors, resistive sensors, temperature sensors, optical scanners or any combination thereof. The presence sensor 50 identifies the action by the operator of touching the cover plate 28.

Figure 4:
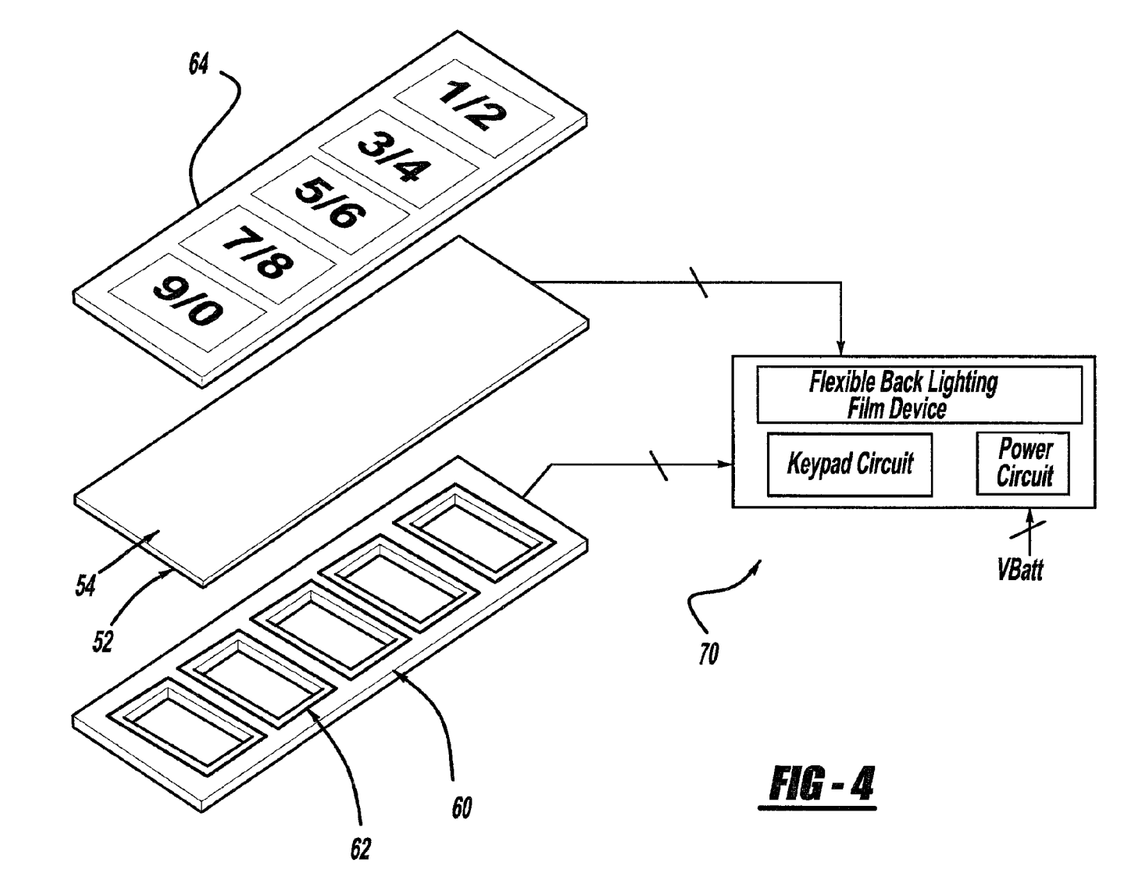
FIG. 4 is an exploded view of part of a dead front actuating system, according to the present invention.
Figure 6:
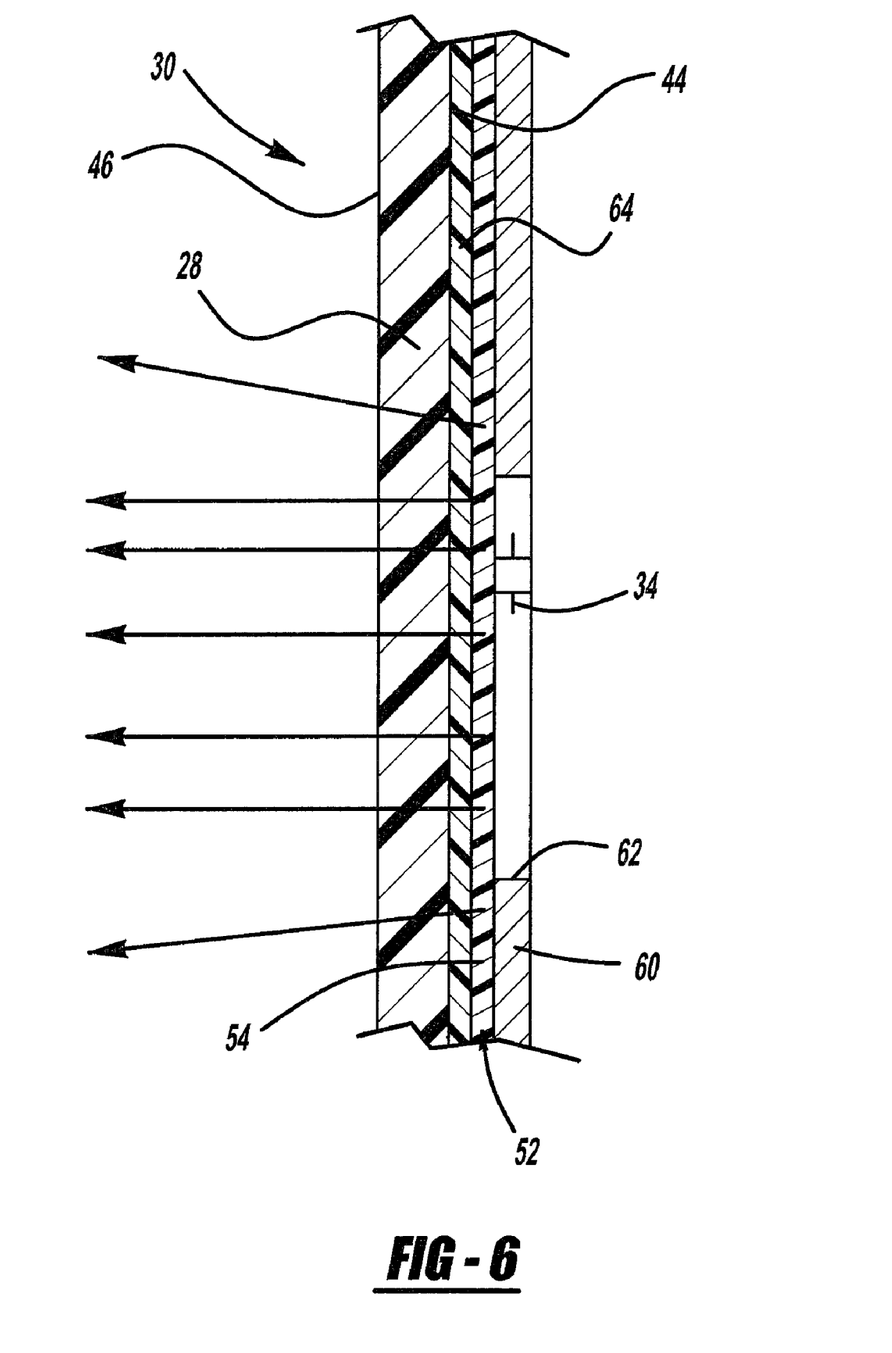
FIG. 6 is a sectional view taken along lines 6-6 of FIG. 3.

The dead front actuation assembly 30 also includes a lighting system inside the housing 36. The lighting system illuminates the cover plate 28 such that light passes through the cover plate 28 and out the outboard surface 46 to illuminate the location of the plurality of switches 34 for the operator. The lighting system includes a first layer, or electroluminescence strip, generally shown at 52, having at least one selectively illuminated area or electroluminescence area, shown generally at 54, which generates the light for the lighting system and is best shown in FIGS. 4, 5 and 6. It should be appreciated that the electroluminescence strip 52 may be varied in size to satisfy the illumination requirements to allow an operator to identify the location of the switches 34. The electroluminescence strip 52 directs light in the interior volume 40 of the housing 36 to be directed toward the inboard surface 44 of the cover plate 28.

The lighting system also includes a second layer, which in this embodiment is a sensor printed circuit board (PCB), generally shown at 60. The switches 34 are mounted to the PCB 60, and are surrounded by a series of antenna traces 62. In the embodiment shown, the presence sensor 50 is a touch sensor and is integrated into the PCB 60 in which the plurality of switches 34 are located. In an alternative embodiment, the presence sensor 50 may be mounted to a circuit board and identifies when the operator of the motor vehicle 10 approaches.

When the electroluminescence strip 52 is activated to produce light, the light from the illuminated area 54 passes through the cover plate 28 to be viewed by the operator as modified by a third layer, which in this embodiment is a layer of graphics 64. The switches 34 and presence sensor 50 are fabricated from electronics that are not, by design, readily visible to the operator. Therefore, the layer of graphics 64 is used to identify the location of each of the switches 34 when the electroluminescence strip 52 is activated. The graphics 64 are not operative in and of themselves but are merely representations of the location of the switches 34, thereby allowing the operator to identify where each of the plurality of switches 34 are located to more accurately and efficiently operate the dead front actuating assembly 30. It is the graphics that are visible in FIG. 3. In an alternative embodiment, there are no graphics and the switches 34 are visible through the back lighting in a manner visible to the operator for selection thereby.

It should be appreciated that the lighting system and delivery mechanism may be any type of lighting system that is able to be incorporated that can overcome opaque qualities of the cover plate 28. Such examples of light source for the lighting system include, but are not limited to, sources that generate light through fluorescent, filament, phosphorescent or laser elements. Fiber optics and/or wave guides may direct the light should the source for the back light need to be in a different location.

Referring to FIG. 5, the dead front actuating assembly is shown in a side view. Connectors (not shown) are mounted to the PCB 60 and connect the dead front actuating assembly 30 to the electronics of the motor vehicle 10 through wires 68 (FIGS. 2 and 3) to receive power and to communicate with latching assembly associated with the side door 12 to identify when it is appropriate to unlock the side door 12. The PCB 60 includes electronics known in the art for providing exterior combination locks that incorporate the traditional numeric keypad. In addition, the PCB 60 is operably associated with a controller 70. The controller 70 includes electronics suitable for providing the necessary voltage to the plurality of switches 34 so the capacitances and changes therewith may be detected. Such changes in capacitance occur when an operator places a finger on the cover plate 28 on or near the location of one of the plurality of switches 34. When the capacitance changes, the electronics on the PCB 60 identify the capacitance change as a selection of a particular location which is identified by the layer of graphics 64. In this particular case, the layer of graphics 64 typically represents letters or numbers (as is shown in FIG. 3). When the selections are made in the right combination, the controller 70 sends a signal through the connectors and the wires 68 to have the side door 12 unlatched by the door latch (not shown). The door handle 16 can then be used to unlock the door 12.

In operation, the dead front actuating assembly 30 is initially in an inactive state. When it is desired to unlock the door 12, the cover plate 28 is initially touched, and the presence sensor 50 sends a signal to the controller 70, which then activates the electroluminescence strip 52, causing the electroluminescence strip 52 to produce light, thereby illuminating the layer of graphics 64. The switches 34 are activated by pressing on the cover plate 28 in the location of the layer of graphics 64 representing each switch 34. As the switches 34 are pressed using the correct combination of numbers (or letters, or a combination of both), the door 12 will become unlocked.

Figure 7:
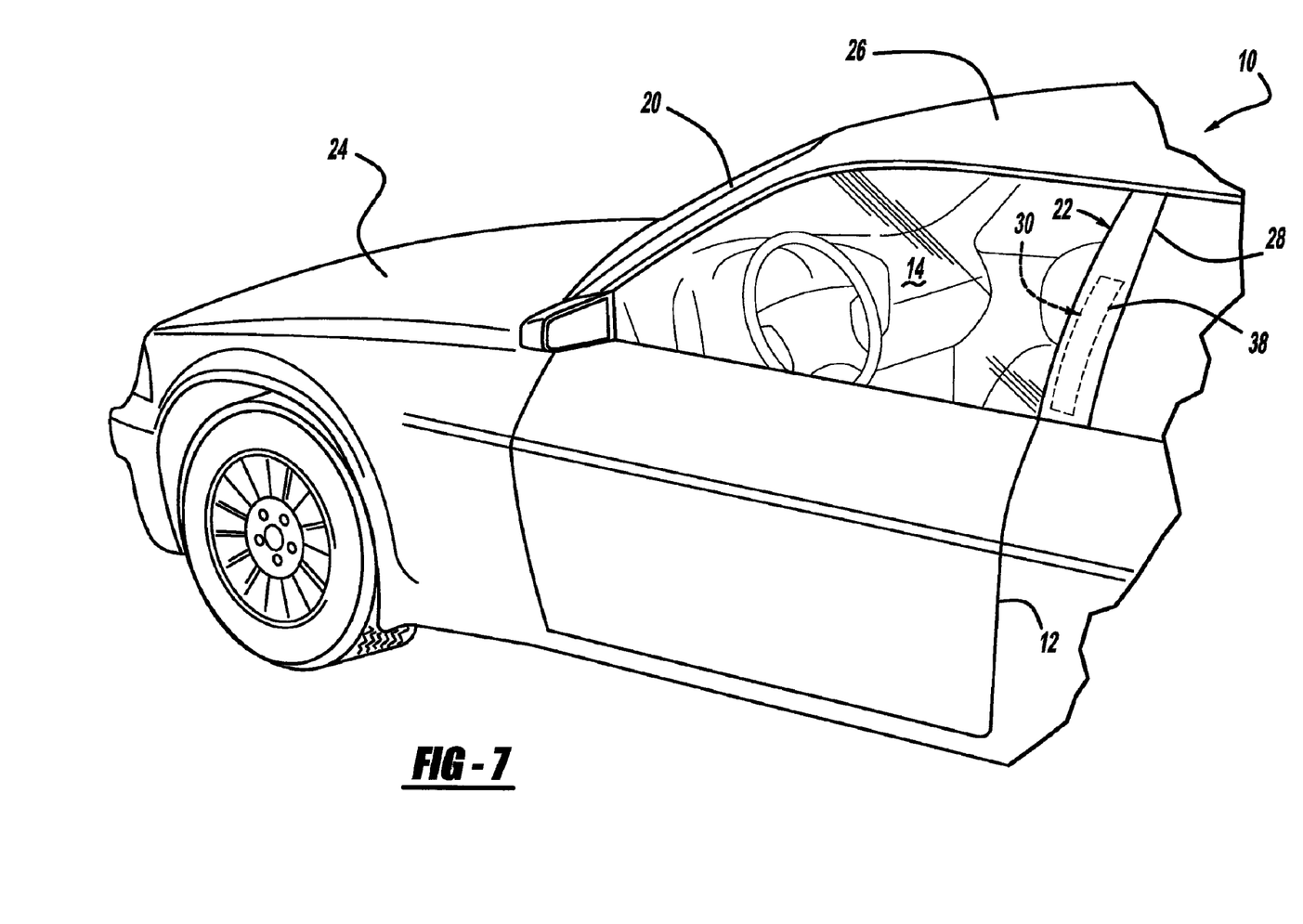
FIG. 7 is a side view of an automobile incorporating an alternate embodiment of a dead front actuating assembly, according to the present invention.
Figure 8:
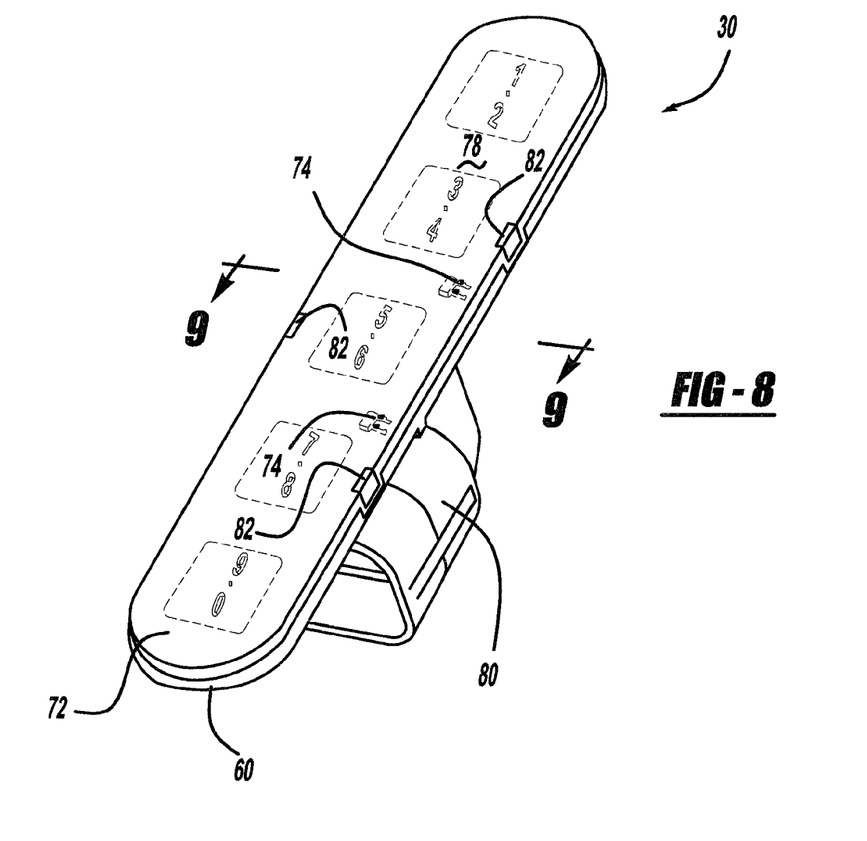
FIG. 8 is a perspective view of an alternate embodiment of a dead front actuating assembly incorporating a microlens, according to the present invention.

Referring to FIG. 7, another embodiment is shown, wherein like numerals represent similar elements to those discussed above. The motor vehicle 10 does not include a door handle or key hole. This motor vehicle 10 utilizes a dead front actuating assembly 30 that can perform multiple functions, e.g. unlock and unlatch the side door 12. This allows the design of the motor vehicle 10 to be further unencumbered by functional features that detract from the aesthetic qualities of the motor vehicle 10.

Another embodiment of the present invention is shown in FIGS. 8-11. In this embodiment, the first layer is not an electroluminescence strip 52, but rather the electroluminescence strip 52 is replaced with a microlens 72, which is mounted on the PCB 60. The microlens 72 also includes at least one light source, which in this embodiment is a pair of light emitting diodes (LEDs) 74 connected to a flex circuit 76. The flex circuit 76 is operably connected to work in conjunction with switches 34 and/or the presence sensors 50 to activate the LEDs 74 when the presence sensors 50 sense the presence of an object such as a finger. The microlens 72 also has a light emitting surface 78, where light is emitted from the microlens 72 in the selectively illuminated area 54. To activate the LEDs 74, a connector 80 is connected to the PCB 60, and the flex circuit 76 (the flex circuit 76 is not shown in FIGS. 8-10). The connector 80 is connected to the wires 68 as in the previous embodiment, which then provides electronic communication between the wires 68 and the LEDs 74, switches 34, and the presence sensors 50. The microlens 72 is connected to the PCB 60 by a series of latches 82, which provide a snap-fit connection between the microlens 72 and the PCB 60.

Figure 9:
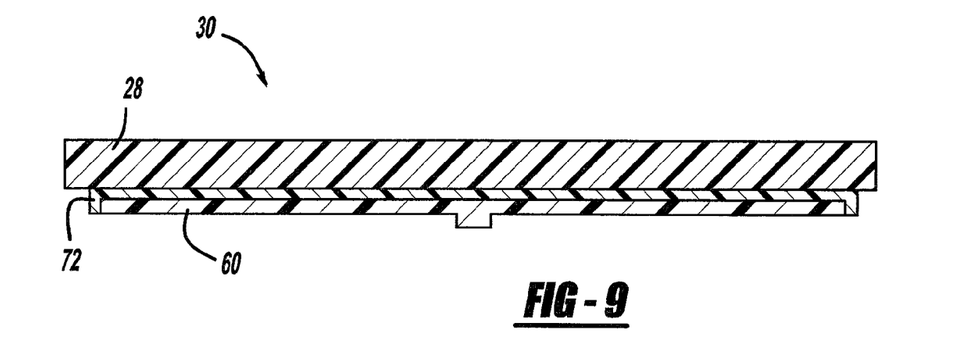
FIG. 9 is a sectional side view of a microlens and PCB board used in a dead front actuating assembly taken along line 9-9 of FIG. 8, according to the present invention.
Figures 10, 11:
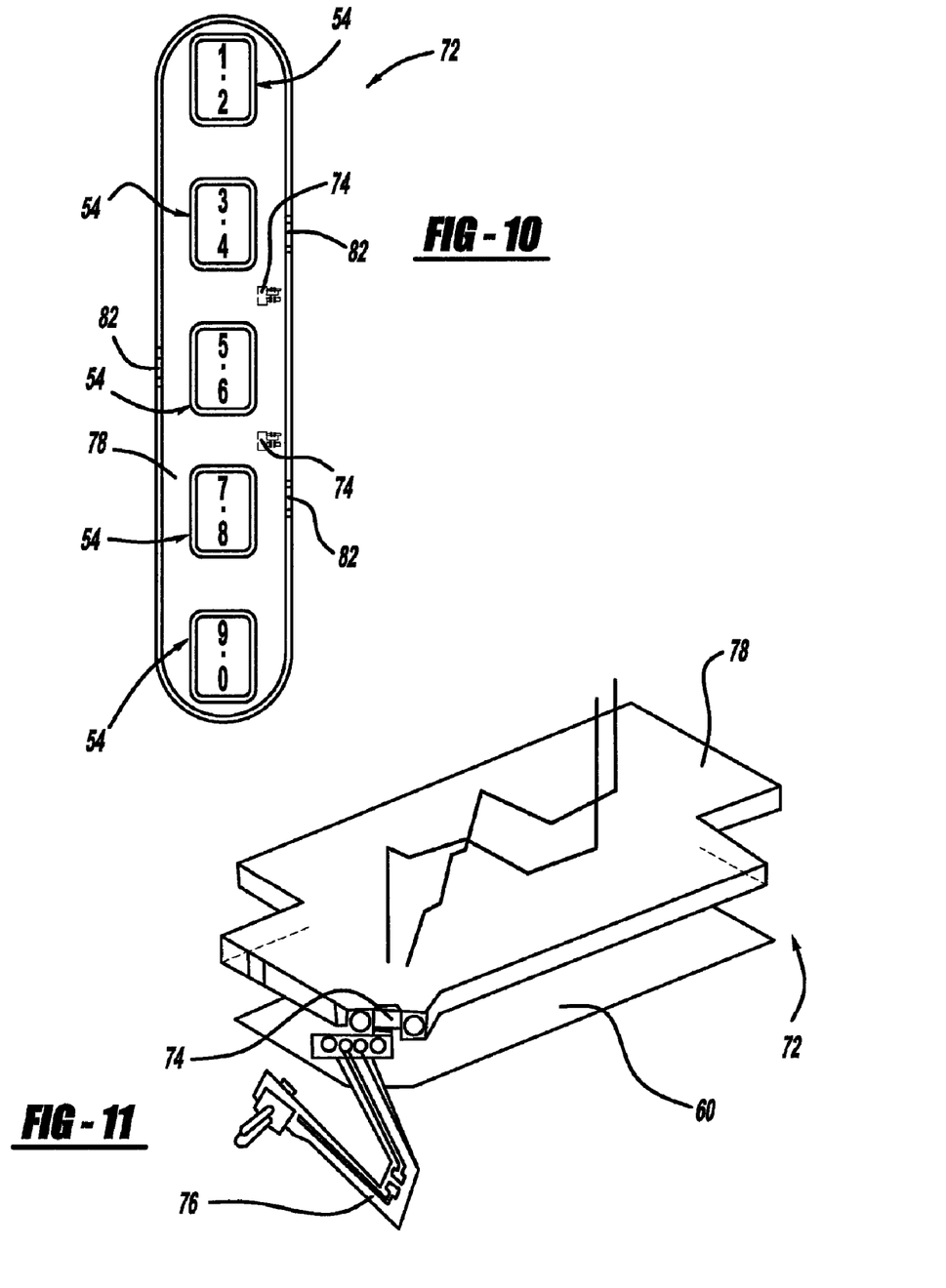
FIG. 10 is top view of an alternate embodiment of a dead front actuating assembly incorporating a microlens, according to the present invention.
FIG. 11 is an exploded view of a microlens used in an alternate embodiment of a dead front actuating assembly, according to the present invention.

Referring now to FIG. 9, a sectional side view is shown with the microlens 72 mounted on the PCB 60, and the microlens 72 positioned behind the cover plate 28. In this embodiment, the microlens 72 is one millimeter in thickness, and the cover plate 28 is three millimeters in thickness. This allows for the distance between the surface of the PCB 60 and the outer surface of the cover plate 28 exposed to atmosphere to be four millimeters. This ensures that when it is desired to operate the switches 34, the user will be able to come close enough to the switches 34 and/or the presence sensors 50 such that the LEDs 74 will activate, and the user can manipulate the switches 34 to unlock or lock the door 12. When the LEDs 74 are active, the LEDs 74 emit light through the microlens 72, and the microlens 72 directs the light to be emitted out of the light emitting surface 78 in a specific pattern to produce an indication of the location of the switches 34. In this embodiment, the light patterns formed on the light emitting surface 78 are each of the selectively illuminated areas 54, shown in FIG. 10. In this embodiment, the selectively illuminated areas 54 form a series of numbers, but could be any other type of pattern used for providing an indication of the switches 34 and/or presence sensors 50.

Once of the advantages of this embodiment is that the microlens 72 has the ability to project light in a specific area, and the angles at which the light is emitted can be controlled to produce an image of the various characters shown on the layer of graphics 64, eliminating the need for the layer of graphics 64. In this embodiment, the microlens 72 is used to produce a beam pattern shown a series of numbers. The LEDs 74 are deactivated in FIG. 8 (with the areas that would be illuminated shown in phantom if the LEDs 74 were activated), and are activated in FIG. 10.

It should be noted that the first layer is not limited to an electroluminescence strip 52 or the microlens 72 described in the embodiments above, the first layer could be any type of flexible, substantially flat object which can be selectively illuminated.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A dead front actuating assembly, comprising:
   a first layer that includes a microlens that projects light in a specific area and control the angles that light is emitted eliminating the need for a graphics layer, said first layer having at least one selectively illuminated area;
   a second layer connected to said microlens to said first layer, said second layer having a plurality of sensors used for activating said at least one selectively illuminated area such that said at least one selectively illuminated area becomes illuminated; and
   a dead front cover connected to said first layer, wherein said dead front cover is opaque with respect to electromagnetic radiation in the visible portion of the spectrum of electromagnetic radiation and transparent with respect to the radio frequency portion of the spectrum of electromagnetic radiation.

2. The dead front actuating assembly of claim 1, further comprising a B-pillar of an automobile, said cover plate forming a portion of said B-pillar of said automobile.

3. The dead front actuating assembly of claim 1, further comprising a third layer, wherein a portion of said third layer allows light from said at least one selectively illuminated area to pass through said third layer, and said first layer is located between said second layer and said third layer.

4. The dead front actuating assembly of claim 3, wherein said at least one selectively illuminated area further comprises an electroluminescence area, and when said at least one selectively illuminated area is illuminated, said layer of graphics provides the location of each of said plurality of sensors.

5. The dead front actuating assembly of claim 1, further comprising:
   a controller operably associated with said first layer such that at least one of said plurality of sensors is used for detecting the presence of an object in proximity to said first layer and said second layer, and at least one of said plurality of sensors is used for providing a signal to said controller, and said controller will activate said at least one selectively illuminated area when said object is detected in proximity to said first layer and said second layer.

6. The dead front actuating assembly of claim 5, further comprising a function performed by said controller when said controller receives said signal from said at least one sensor used for providing a signal to said controller.

7. The dead front actuating assembly of claim 6, wherein said at least one sensor used for providing a signal to said controller provides a plurality of signals, and said plurality of signals command said controller to perform said function.

8. The dead front actuating assembly of claim 6, said function further comprising unlocking and locking a door of an automobile.

9. The dead front actuating assembly of claim 1 wherein said microlens further comprises at least one light source, and said at least one selectively illuminated area is formed as a portion of said microlens.

10. The dead front actuating assembly of claim 1, said second layer further comprising a printed circuit board, wherein said plurality of sensors are mounted on said printed circuit board.

11. A dead front actuating assembly for a vehicle, comprising:
    a first layer having at least one selectively illuminated area, wherein said first layer includes a mircrolens that projects light in a specific area and controls the angles that light is emitted eliminating the need for a graphics layer;
    a second layer connected to said first layer having a plurality of sensors, operably associated with said first layer;
    a dead front cover connected to and concealing said first layer and said second layer, wherein said dead front cover is opaque with respect to electromagnetic radiation in the visible portion of the spectrum of electromagnetic radiation and transparent with respect to the radio frequency portion of the spectrum of electromagnetic radiation; and
    a controller for receiving a plurality of signals from said plurality of sensors, and when said controller receives said plurality of signals from said plurality of sensors, said controller will perform a function in said vehicle.

12. The dead front actuating assembly of claim 11, said first layer further comprising an electroluminescence strip, said at least one selectively illuminated area further comprising at least one electroluminescence area.

13. The dead front actuating assembly of claim 11, further comprising said controller will actuate said at least one selectively illuminated area to become illuminated when at least one of said plurality of sensors senses the presence of an object near said second layer, and when said at least one of said plurality of sensors for sensing the presence of an object near said second layer senses an object.

14. The dead front actuating assembly of claim 11, further comprising when said at least one selectively illuminated area is illuminated, said at least one selectively illuminated area projects light through said cover plate, allowing at least a portion of said first layer to be seen.

15. The dead front actuating assembly of claim 11, said vehicle further comprising a B-pillar, wherein said cover plate comprises a portion of said B-pillar.

16. The dead front actuating assembly of claim 11, wherein said controller is used for performing a function in said vehicle when said controller receives said plurality of signals from said plurality of sensors.

17. The dead front actuating assembly of claim 16, said function further comprising unlocking and locking a door of said vehicle.

18. The dead front actuating assembly of claim 11, wherein said microlens further comprising at least one light source, and when said at least one light source is illuminated, said microlens directs light from said light source to produce a desired beam pattern through said cover plate, indicating the position of said plurality of sensors.

19. The dead front actuating assembly of claim 11, said second layer further comprising a printed circuit board, wherein said plurality of sensors are mounted on said printed circuit board.

20. A dead front actuating assembly for performing a function in a vehicle, comprising:
- a first layer having at least one selectively illuminated area, wherein said first layer includes a microlens that projects light in a specific area and controls the angles that light is emitted, eliminating the need for a graphics layer;
- a sensor printed circuit board having a plurality of sensors adjacent said at least one selectively illuminated area;
- a dead front cover for concealing said first layer and said sensor printed circuit board, wherein said dead front cover is opaque with respect to electromagnetic radiation in the visible portion of the spectrum of electromagnetic radiation and transparent with respect to the radio frequency portion of the spectrum of electromagnetic radiation; and
- a controller for receiving at least two types of signals from said plurality of sensors, and when said controller receives one of said at least two types of signals from said plurality of sensors, said controller will command a door of a vehicle to lock or unlock, and when said controller receives another of said at least two types of signals from said plurality of sensors, said controller will command said first layer to activate said at least one selectively illuminated area.

21. The dead front actuating assembly for performing a function in a vehicle of claim 20, said first layer further comprising an electroluminescence strip, and said at least one selectively illuminated area further comprising at least one electroluminescence area.

22. The dead front actuating assembly for performing a function in a vehicle of claim 20, said first layer further comprising a microlens having at least one light source, and said at least one selectively illuminated area formed as a portion of said microlens, wherein said at least one selectively illuminated area is illuminated by said at least one light source, indicating the location of said plurality of sensors.

23. The dead front actuating assembly for performing a function in a vehicle of claim 20, wherein said cover plate forms a portion of a B-pillar in an automobile.

* * * * *